US012684740B2

(12) United States Patent
Lee et al.

(10) Patent No.: US 12,684,740 B2
(45) Date of Patent: Jul. 14, 2026

(54) ELECTRONIC DEVICE AND CONTROL METHOD OF FAN SPEED THEREOF

(71) Applicant: Wiwynn Corporation, New Taipei City (TW)

(72) Inventors: Cyuan Lee, New Taipei City (TW); Geng-Ting Liu, New Taipei City (TW); Ming-Feng Hsieh, New Taipei City (TW); I Wei Chiu, New Taipei City (TW); Chia Ming Tsai, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 561 days.

(21) Appl. No.: 18/047,333

(22) Filed: Oct. 18, 2022

(65) Prior Publication Data

US 2024/0023289 A1      Jan. 18, 2024

(30) Foreign Application Priority Data

Jul. 13, 2022    (TW) .................................. 111126213

(51) Int. Cl.
*H05K 7/20*          (2006.01)
(52) U.S. Cl.
CPC ................................ *H05K 7/20836* (2013.01)
(58) Field of Classification Search
CPC .. F24F 11/64; F24F 11/38; F24F 11/63; F24F 11/62; G06F 1/20; G06F 1/206; G06F 11/3058
See application file for complete search history.

(56) References Cited

U.S. PATENT DOCUMENTS

| | | | | |
|---|---|---|---|---|
| 5,996,898 | A | * | 12/1999 | Parker .................... F24F 7/007 236/51 |
| 2008/0024983 | A1 | * | 1/2008 | Anderl ............... H05K 7/20836 361/695 |
| 2012/0215359 | A1 | * | 8/2012 | Michael .................. G06F 1/206 700/275 |
| 2013/0013752 | A1 | * | 1/2013 | Herrera Van Der Nood .............. H04L 41/0889 709/220 |
| 2013/0096720 | A1 | * | 4/2013 | Brey .................. H05K 7/20209 700/276 |
| 2013/0333871 | A1 | * | 12/2013 | Pimlott .............. G05D 23/1919 236/49.3 |
| 2015/0074749 | A1 | * | 3/2015 | Vasko ..................... H04L 67/12 726/1 |
| 2015/0081878 | A1 | * | 3/2015 | Pabba ................. H04L 41/0213 709/224 |
| 2016/0363341 | A1 | * | 12/2016 | Arens ...................... F24F 11/77 |
| 2017/0336839 | A1 | * | 11/2017 | Ho ........................ G05B 19/406 |
| 2018/0090180 | A1 | * | 3/2018 | Zhai ..................... G11B 33/144 |

(Continued)

*Primary Examiner* — Darrin D Dunn
(74) *Attorney, Agent, or Firm* — McClure, Qualey & Rodack, LLP

(57) ABSTRACT

An electronic device includes a storage array, a row fan, a distance sensor, and a controller. The storage array includes a plurality of storage units. The row fan cools the storage array. The distance sensor senses the distance between the storage array and the row fan and outputs a corresponding distance signal. The controller receives the distance signal and sets the distance threshold of each of the storage units. When the distance is longer than the distance threshold, the controller outputs a control signal to the row fan to increase the rotation speed of the row fan.

19 Claims, 5 Drawing Sheets

100

(56)  References Cited

U.S. PATENT DOCUMENTS

| | | | | |
|---|---|---|---|---|
| 2018/0108339 A1* | 4/2018 | Young | .................. | G10K 11/161 |
| 2018/0310434 A1* | 10/2018 | Young | .................. | G10K 11/161 |
| 2019/0174657 A1* | 6/2019 | Zhai | .................. | H05K 7/20836 |
| 2019/0198060 A1* | 6/2019 | Adrian | .................. | G11B 33/10 |
| 2020/0315070 A1* | 10/2020 | Holland | ................ | F04D 25/166 |
| 2020/0358854 A1* | 11/2020 | Hobgood | ................ | F24F 11/54 |
| 2021/0329813 A1* | 10/2021 | Shabbir | ............. | H05K 7/20136 |
| 2022/0147128 A1* | 5/2022 | Stevens | .................. | G06F 1/206 |
| 2022/0319297 A1* | 10/2022 | Mccullough | ........... | G08B 21/18 |
| 2023/0180370 A1* | 6/2023 | Pijlman | .................. | F21V 29/60 |
| | | | | 315/117 |
| 2023/0270304 A1* | 8/2023 | Geis | ..................... | A47L 9/2894 |
| | | | | 701/23 |
| 2023/0383759 A1* | 11/2023 | Liu | ...................... | F04D 27/004 |

* cited by examiner

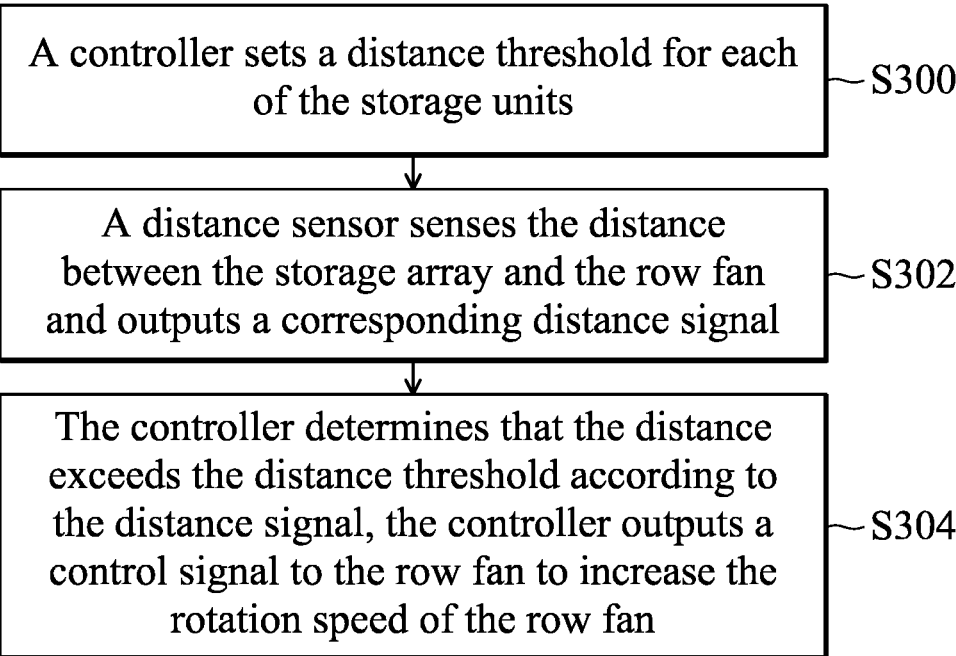

A controller sets a distance threshold for each of the storage units          ─S300

A distance sensor senses the distance between the storage array and the row fan and outputs a corresponding distance signal          ─S302

The controller determines that the distance exceeds the distance threshold according to the distance signal, the controller outputs a control signal to the row fan to increase the rotation speed of the row fan          ─S304

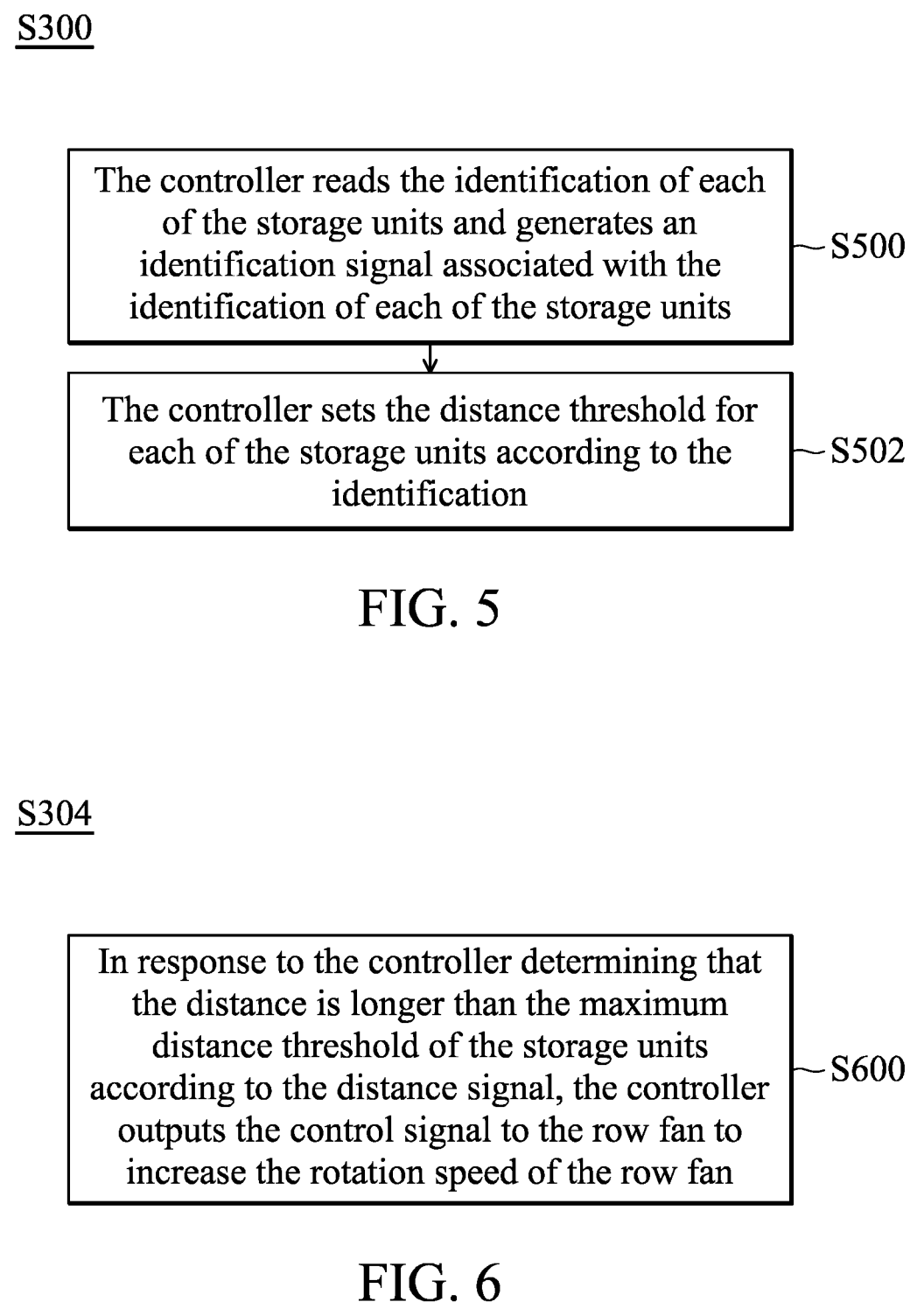

The controller reads the identification of each of the storage units and generates an identification signal associated with the identification of each of the storage units —S500

The controller sets the distance threshold for each of the storage units according to the identification —S502

In response to the controller determining that the distance is longer than the maximum distance threshold of the storage units according to the distance signal, the controller outputs the control signal to the row fan to increase the rotation speed of the row fan —S600

FIG. 6

ELECTRONIC DEVICE AND CONTROL METHOD OF FAN SPEED THEREOF

CROSS REFERENCE TO RELATED APPLICATIONS

This application claims the benefit of Taiwan Application 111126213, filed on Jul. 13, 2022, the entirety of which is/are incorporated by reference herein.

BACKGROUND OF THE INVENTION

Field of the Invention

The present disclosure relates to an electronic device, and, in particular, to an electronic device with a fan and a control method for the fan.

Description of the Related Art

Existing storage servers generally include hard disks disposed in an array, and cooling fans are required for cooling. When a hard disk in the storage server needs to be repaired, the position of the hard disk in the storage server needs to be moved to facilitate the removal of the hard disk to be repaired. Since the position of the hard disk in the storage server is changed, the cooling wind field of the originally designed cooling fan also changes accordingly. In order to maintain the cooling effect, the rotation speed of the cooling fan is usually set to the maximum rotation speed.

In order to maintain the cooling effect, the rotation speed of the cooling fan is usually set to the maximum rotation speed. Therefore, how to take into account the cooling of the hard disk and working efficiency has become an important issue.

BRIEF SUMMARY OF THE INVENTION

An embodiment of the present disclosure provides an electronic device. The electronic device includes a storage array, a row fan, and a controller. The storage array includes a plurality of storage units. The row fan includes at least one fan and cools the storage array. The controller receives a distance signal corresponding to a distance between the storage array and the row fan. When the distance is longer than a distance threshold, the controller outputs a control signal to the row fan to increase the rotation speed of the row fan.

An embodiment of the present disclosure provides a control method. The control method is suitable for an electronic device having a storage array, a row fan, a distance sensor, a relative motion sensor, and a controller. The storage array includes a plurality of storage units. The control method includes the stages as detailed in the following paragraph. The distance sensor senses the distance between the storage array and the row fan and outputs a corresponding distance signal. When the controller determines that the distance exceeds the distance threshold based on the distance signal, it outputs a control signal to the row fan to increase the rotation speed of the row fan.

BRIEF DESCRIPTION OF THE DRAWINGS

The present disclosure can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration. This means that many special details, relationships and methods are disclosed to provide a complete understanding of the present disclosure.

FIG. 3 is a flow chart of a control method for the rotation speed of a fan in accordance with some embodiments of the present disclosure.

FIG. 5 is a detailed flowchart of step S300 in FIG. 3 in accordance with some embodiments of the present disclosure.

FIG. 6 is a detailed flowchart of step S304 in FIG. 3 in accordance with some embodiments of the present disclosure.

DETAILED DESCRIPTION OF THE INVENTION

Certain words are used to refer to specific elements in the specification and the claims. Those with ordinary knowledge in the technical field should understand that hardware manufacturers may use different terms to refer to the same component. The specification and the claims of the present disclosure do not use differences in names as a way to distinguish elements, but use differences in functions of elements as a criterion for distinguishing. The "comprise" and "include" mentioned in the entire specification and the claims are open-ended terms, so they should be interpreted as "including but not limited to". "Generally" means that within an acceptable error range, a person with ordinary knowledge in the technical field can solve the technical problem within a certain error range, and basically achieve the technical effect. In addition, the term "coupled" herein includes any direct and indirect electrical connection means. Therefore, if it is described in the text that a first device is coupled to a second device, it means that the first device can be directly electrically connected to the second device, or indirectly electrically connected to the second device through other devices or connecting means. The following descriptions are preferred ways to implement the present disclosure. The purpose is to illustrate the spirit of the present disclosure and not to limit the scope of protection of the present disclosure.

The following description is the best embodiment expected of the present disclosure. These descriptions are used to illustrate the general principles of the present disclosure and should not be used to limit the present disclosure. The protection scope of the present disclosure should be determined on the basis of referring to the scope of the claims of the present disclosure.

Figure 1:
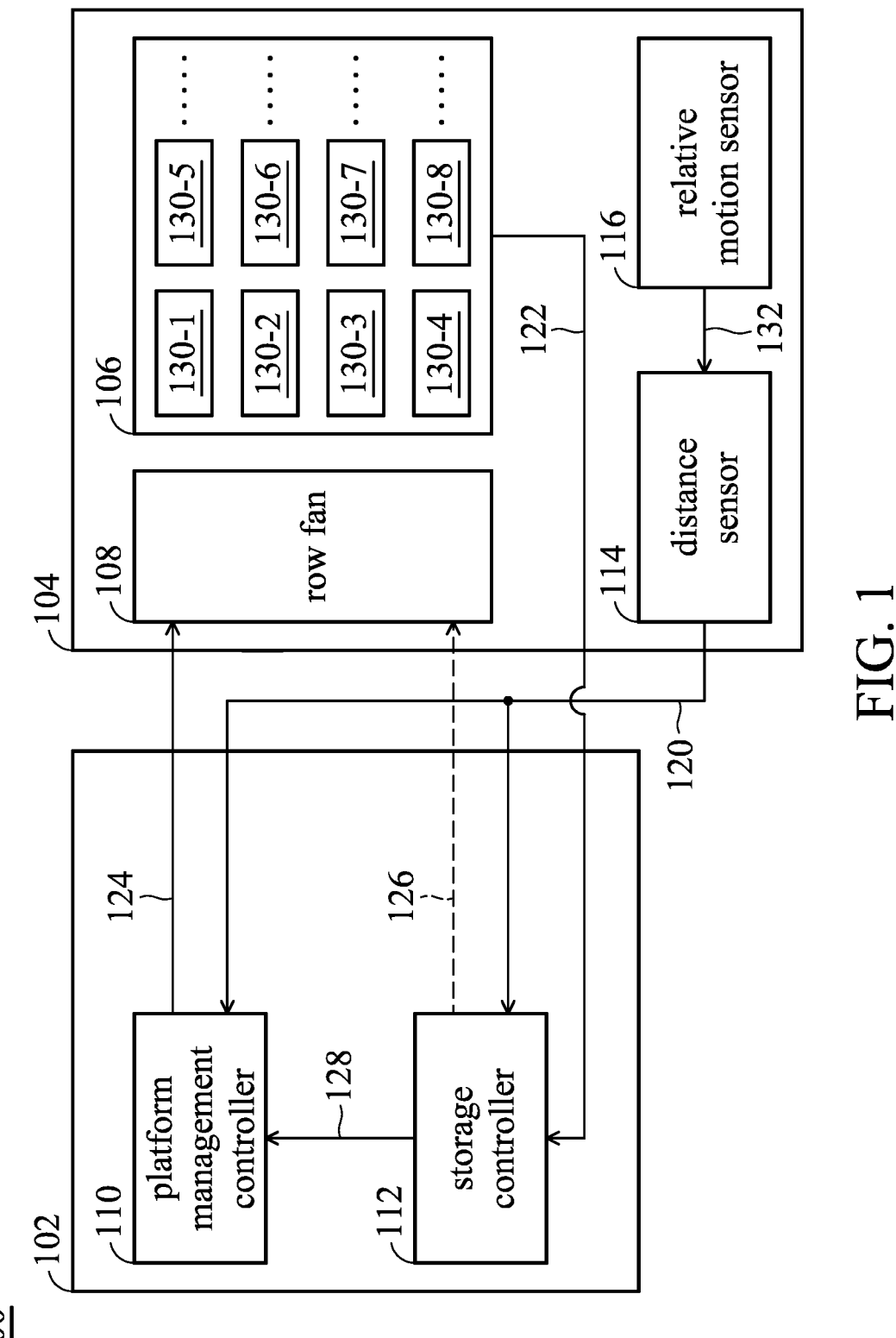
FIG. 1 is a schematic diagram of an electronic device 100 in accordance with some embodiments of the present disclosure.

FIG. 1 is a schematic diagram of an electronic device 100 in accordance with some embodiments of the present disclosure. The electronic device 100 in FIG. 1 includes a controller 102 and a drive plane board 104. In some embodiments, the drive plane board 104 includes a storage array 106, a row fan 108, a distance sensor 114, and a relative motion sensor 116. In some embodiments, the storage array 106 includes a plurality of storage units, such as a storage unit 130-1, a storage unit 130-2, a storage unit 130-3, a storage unit 130-4, a storage unit 130-5, a storage unit 130-6, a storage unit 130-7, and storage unit 130-8, but the present disclosure is not limited thereto. In some embodiments, the row fan 108 cools the storage array 106. The row fan 108 includes one or more fans, but the present disclosure is not limited thereto.

In some embodiments, the distance sensor 114 senses the distance between the storage array 106 and the row fan 108, and outputs a distance signal 120 that corresponds to the distance between the storage array 106 and the row fan 108. In some embodiments, the distance sensor 114 includes an infrared ranging module.

In some embodiments, the controller 102 receives the distance signal 120, and sets the distance threshold of each of the storage units (for example, the storage unit 130-1, the storage unit 130-2, the storage unit 130-3, the storage unit 130-4, the storage unit 130-5, the storage unit 130-6, the storage unit 130-7, and the storage unit 130-8). The controller 102 is configured to determine whether the distance between the storage array 106 and the row fan 108 is longer than the distance threshold according to the distance signal 120 and the distance threshold. When the distance between the storage array 106 and the row fan 108 is longer than the distance threshold, the controller 102 outputs a control signal 124 to the row fan 108 to increase the rotation speed of the row fan 108. In some embodiments, the row fan 108 can rotate at full speed according to the control signal 124, but the present disclosure is not limited thereto.

The relative motion sensor 116 detects the relative motion of the storage array 106 from a preset position with the row fan 108, and outputs a corresponding enable signal 132. Next, the distance sensor 114 starts to sense the distance between the storage array 106 and the row fan 108 according to the enable signal 132. In some embodiments, the relative motion sensor 116 is a far-infrared sensor, but the present disclosure is not limited thereto. The relative motion sensor 116 may include a transmitting end and a receiving end (not shown). The transmitting end transmits the far infrared to the receiving end. The relative motion sensor 116 then determines whether the relative motion occurs according to whether the receiving end receives the far infrared from the transmitting end. In some embodiments, the relative motion sensor 116 includes a Hall sensor, but the present disclosure is not limited thereto.

In some embodiments of FIG. 1, the controller 102 includes a platform management controller 110 and a storage controller 112. In some embodiments, the storage controller 112 reads the identification 122 of each of the storage units, and generates an identification signal 128 associated with the identification 122 of each of the storage units. In some embodiments, the platform management controller 110 is connected to the Internet to read the distance thresholds of each of the storage units from a database (not shown) according to the identification signal 128. In some embodiments, the database stores a table (not shown) recording the identification of each of the storage units and the distance thresholds corresponding to each of the storage units.

For example, the table records the identification A and the distance threshold a of the storage unit 130-1, the identification B and the distance threshold b of the storage unit 130-2, the identification C and the distance threshold c of the storage unit 130-3, the identification D and the distance threshold d of the storage unit 130-4, the identification E and the distance threshold e of the storage unit 130-5, the identification F and the distance threshold f of the storage unit 130-6, the identification G and the distance threshold g of the storage unit 130-7, and the identification H and the distance threshold h of the storage unit 130-8. In other words, the identification 122 includes information such as the identifications A to H. The identifications A to H may be different from each other, but the distance thresholds a to h may all be the same, all different, or partially the same.

In some embodiments, the distance threshold of a storage unit is determined according to the level of noise generated by the row fan 108 measured at the position of the storage unit. For example, the process of determining the distance threshold may include step 1 and step 2. In step 1, the distance between each of the storage units and the rotating (e.g., at full speed) row fan 108 is varied, and the decibel level of the noise is measured at each of the storage units at each different distance. In general, the smaller the distance is, the higher the decibel level is. In step 2, a minimum distance corresponding to noise that is under a predetermined decibel level is selected as the distance threshold for each of the storage units. In some cases, performing the above process with different storage units (such as different brands or models of the storage) may obtain different distance thresholds. In some embodiments, the distance threshold of each of the storage units is stored in the table in the database or in a non-volatile memory (not shown) of the storage controller 112. In some embodiments, the platform management controller 110 can read the table in the database, or the table in the non-volatile memory of the storage controller 112, to obtain the distance threshold of each of the storage units.

In some embodiments, the predetermined decibel level is defined according to the working efficiency of each storage unit under the influence of the noise emitted by the row fan 108. For example, in the absence of noise, the working efficiency of each storage unit is 100%. In some embodiments, when the noise emitted by the row fan 108 is at the predetermined decibel level, each storage unit can still maintain the working efficiency of 95%, but the present disclosure is not limited thereto. Finally, the distance threshold of each storage unit may be stored in the database where it can be read by the platform management controller 110.

In some embodiments, the distance thresholds of a row of storage units (e.g., the storage unit 130-1, the storage unit 130-2, the storage unit 130-3, and the storage unit 130-4) of the storage array 106 closest to the row fan 108 are the same. When the platform management controller 110 determines that the distance between the storage array 106 and the row fan 108 is longer than the distance threshold, the platform management controller 110 outputs the control signal 124 to the row fan 108, so that the row fan 108 increase the rotation speed (e.g., full speed). At this time, the working efficiency of all the storage unit 130-1, the storage unit 130-2, the storage unit 130-3, and the storage unit 130-4 (arranged closest to the row fan 108) can also be maintained above 95%.

In some embodiments, when the controller 102 or the platform management controller 110 determines the distance is longer than the longest one of the distance thresholds of the storage units according to the distance signal 120, the controller 102 or the platform management controller 110 outputs the control signal 124 to the row fan 108 to increase the rotation speed of the row fan 108. For example, in some scenarios, the distance threshold a of the storage unit 130-1 is longer than the distance threshold b of the storage unit 130-2, and the distance threshold b of the storage unit 130-2 is longer than the distance threshold c of the storage unit 130-3. In such scenarios, when the controller 102 or the platform management controller 110 determines according to the distance signal 120 that the distance between the storage array 106 and the row fan 108 is longer than the distance threshold a of the storage unit 130-1 (e.g., the longest one of the distance thresholds a, b and c), the controller 102 or the platform management controller 110 outputs the control signal 124 to the row fan 108, so that the row fan 108 increases the rotation speed according to the control signal 124, and the working efficiency of the storage unit 130-1, the storage unit 130-2, and the storage unit 130-3 can all be maintained above 95%.

In some embodiments, the controller 102 or the platform management controller 110 outputs the control signal 124 to the row fan 108 when the controller 102 or the platform management controller 110 determines according to the distance signal 120 that the distance between the storage array 106 and the row fan 108 is longer than any one of the above-mentioned distance thresholds a, b, and c (for example, the distance threshold b, which is not the longest one). However, at this time, since the distance between the storage array 106 and the row fan 108 is still shorter than the distance threshold a (larger than b and c) of the storage unit 130-1, the storage unit 130-1 may be affected by the noise emitted by the row fan 108, so that the working efficiency of the storage unit 130-1 may be lower than 95%.

In some embodiments, the storage controller 112 may include a non-volatile memory (not shown). The non-volatile memory has stored the table in the database. Therefore, there is no need for the platform management controller 110 to read the relationship table from the database through the Internet. That is, when the storage controller 112 receives the distance signal 120 from the distance sensor 114, the storage controller 112 is able to determine, according to the distance signal 120 and the table stored in the non-volatile memory, that the distance between the storage array 106 and the row fan 108 is longer than the longest one of the distance thresholds of the storage units, and the storage controller 112 output a control signal 126 to the row fan 108, so that the row fan 108 increase the rotation speed.

Figure 2:
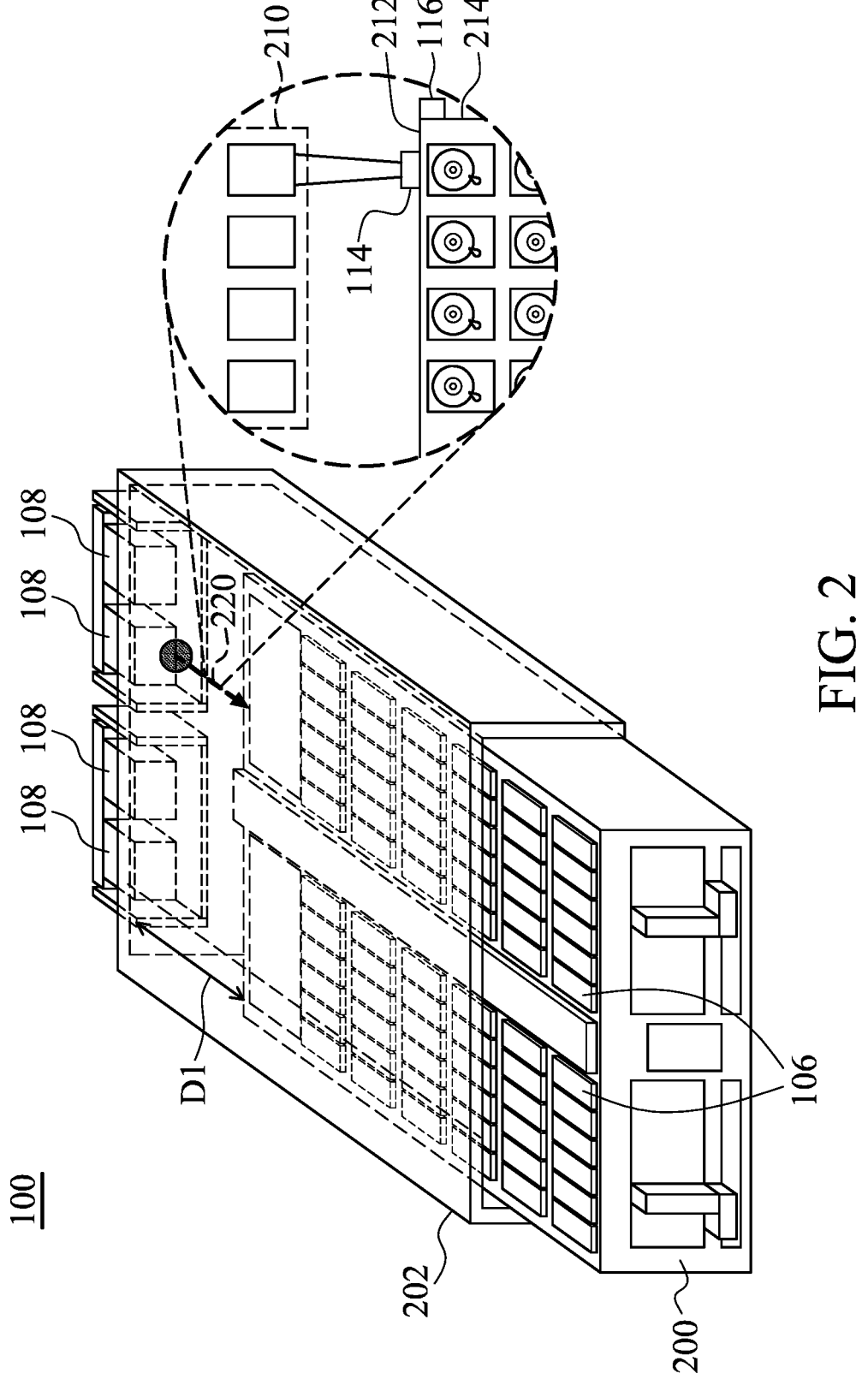
FIG. 2 is a three-dimensional schematic diagram of the electronic device 100 in FIG. 1 in accordance with some embodiments of the present disclosure.

FIG. 2 is a three-dimensional schematic diagram of the electronic device 100 in FIG. 1 in accordance with some embodiments of the present disclosure. As shown in FIG. 2, the electronic device 100 includes a drawer structure 200 and a casing 202. The drawer structure 200 is disposed in the casing 202, and is suitable for the relative motion with the casing 202 in one direction. The storage array 106 is disposed in the drawer structure 200. In some embodiments, although the storage array 106 in FIG. 2 includes 72 storage cells, the present disclosure does not limit the number of storage cells included in the storage array 106. The row fan 108 is disposed on a backplane 210. The backplane 210 faces a plane 212 of the drawer structure 200. Although FIG. 2 shows that the distance sensor 114 is disposed on the plane 212 of the drawer structure 200, the distance sensor 114 can also be disposed on the backplane 210 (e.g., on the same side as the row fan 108), and the present disclosure is not limited thereto. In some embodiments, the row fan 108 can be disposed on the casing 202, but the present disclosure is not limited thereto.

In some embodiments, although FIG. 2 shows that the relative motion sensor 116 is disposed on the plane 214 of the drawer structure 200, the relative motion sensor 116 can also be disposed on the casing 202, and the present disclosure is not limited thereto. Taking the arrangement of the relative motion sensor 116 in FIG. 2 as an example, the casing 202 may include a mechanical component (not shown) disposed between the transmitting end and the receiving end of the relative motion sensor 116. In other words, the mechanical component is used to shield the far infrared emitted from the transmitting end of the relative motion sensor 116.

For example, in the initial state, that is, the relative motion sensor 116 is in a preset position. In the initial state, the mechanical component of the casing 202 is shielded between the transmitting end and the receiving end of the relative motion sensor 116, and the receiving end of the relative motion sensor 116 cannot receive the far infrared from the transmitting end, so the relative motion sensor 116 determines that the storage array 106 and the row fan 108 does not have relative motion between each other. When the drawer structure 200 moves (e.g., in the direction 220), the relative motion sensor 116 has left the preset position. When the mechanical components of the casing 202 are not completely shielded between the transmitting end and the receiving end of the relative motion sensor 116, the receiving end of the relative motion sensor 116 can receive the far infrared from the transmitting end. Therefore, the relative motion sensor 116 determines that the storage array 106 and the row fan 108 have relative motion between each other, and outputs the enable signal 132 to the distance sensor 114, so that the distance sensor 114 starts to sense the distance D1 between the storage array 106 and the row fan 108.

FIG. 3 is a flow chart of the control method for the rotation speed of a fan in accordance with some embodiments of the present disclosure. The control method of the rotation speed of the fan is suitable for the electronic device 100 in FIG. 1. As shown in FIG. 3, the control method of the rotation speed of the fan of the present disclosure includes the stages as detailed in the following paragraph. The controller (e.g., the controller 102 in FIG. 1) sets a distance threshold for each of the storage units (e.g., the storage units 130-1 to 130-8 in FIG. 1) (step S300). The distance sensor (e.g., the distance sensor 114 in FIG. 1) senses the distance between the storage array (e.g., the storage array 106 in FIG. 1) and the row fan (e.g., the row fan 108 in FIG. 1), and outputs a corresponding distance signal (e.g., the distance signal 120 in FIG. 1) based on the distance (step S302). When the controller determines that the distance exceeds the distance threshold according to the distance signal, it outputs a control signal (e.g. the control signal 124 in FIG. 1) to the row fan to increase the rotation speed of the row fan (step S304).

Figure 4:
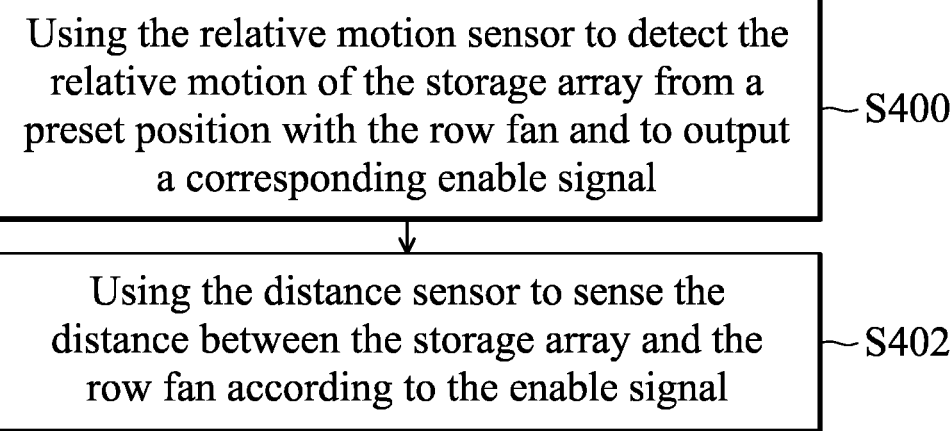
FIG. 4 is a flow chart of the control method of the rotation speed of the fan in accordance with some embodiments of the present disclosure.

FIG. 4 is a flow chart of the control method of the rotation speed of the fan in accordance with some embodiments of the present disclosure. The control method of the rotation speed of the fan of the present disclosure in FIG. 4 is suitable for the relative motion sensor 116 and the distance sensor 114 of the electronic device 100 in FIG. 1. As shown in FIG. 4, the control method of the rotation speed of the fan of the present disclosure includes the stages as detailed in the following paragraph. The relative motion sensor detects the relative motion of the storage array from a preset position with the row fan, and outputs a corresponding enable signal (e.g., the enable signal 132 in FIG. 1) (step S400). The distance sensor senses the distance between the storage array and the row fan according to the enable signal (step S402).

FIG. 5 is a detailed flowchart of step S300 in FIG. 3 in accordance with some embodiments of the present disclosure. The control method of the rotation speed of the fan of the present disclosure in FIG. 5 is suitable for the controller 102 of the electronic device 100 in FIG. 1. As shown in FIG. 5, step S300 in FIG. 3 includes the stages as detailed in the following paragraph. The controller reads the identification of each of the storage units, and generates an identification signal (e.g., the identification signal 128) associated with the identification of each of the storage units (step S500). The controller sets the distance threshold for each of the storage units according to the identification (step S502). In some embodiments, the identification of each storage unit comes from the database, but the present disclosure is not limited thereto. In some embodiments, the present disclosure determines the distance threshold for each storage unit according to the noise level emitted by the row fan 108 measured at the position of each of the storage units. The present disclosure further stores the distance threshold for each storage unit in the database where it can be read by the controller 102 or the platform management controller 110. In some embodiments, when the relative motion sensor 116 detects the relative motion of the storage array 106 from a preset position with the row fan 108, and the noise emitted by the row fan 108 measured at the position of each storage unit is under the predetermined decibel level, the present disclosure sets the distance between the current storage array 106 and the row fan 108 as the distance threshold for each storage unit.

FIG. 6 is a detailed flowchart of step S304 in FIG. 3 in accordance with some embodiments of the present disclosure. The control method of the rotation speed of the fan of the present disclosure in FIG. 6 is suitable for the controller 112 of the electronic device 100 in FIG. 1. As shown in FIG. 6, step S304 in FIG. 3 includes the stages as detailed in the following paragraph. The controller determines the distance (between the storage array 106 and the row fan 108) is longer than the maximum distance threshold of the storage units (i.e., the longest one of the thresholds of the storage units) according to the distance signal, and outputs the control signal to the row fan to increase the rotation speed of the row fan.

Although the present disclosure is disclosed above in the preferred embodiment, it is not intended to limit the scope of the present disclosure. Anyone with ordinary knowledge in the relevant technical field can make changes and modifications without departing from the spirit and scope of the present disclosure. Therefore, the protection scope of the present disclosure shall be determined by the scope of the claims.

What is claimed is:

1. An electronic device, comprising:
a storage array, comprising a plurality of storage units;
a row fan, comprising at least one fan and configured to cool the storage array; and
a controller, configured to receive a distance signal corresponding to a distance between the storage array and the row fan, and determines a distance threshold for each of the storage units;
wherein when the distance is longer than the distance threshold, the controller is configured to output a control signal to the row fan to increase a rotation speed of the row fan;
wherein determining the distance threshold for each of the storage units comprises:
changing the distance between each of the storage units and the row fan, and recording a decibel level of noise measured at a position of each of the storage units corresponding to different distances; and
selecting a minimum distance corresponding to the noise that is under a predetermined decibel level as the distance threshold for each of the storage units;
wherein the predetermined decibel level is defined according to a working efficiency of each storage unit under influences of the noise emitted by the row fan.

2. The electronic device as claimed in claim 1, wherein the controller is configured to read an identification of each of the storage units and to set the distance threshold of each of the storage units according to the identification.

3. The electronic device as claimed in claim 2, wherein the controller comprises:
a storage controller, configured to read the identification of each of the storage units and to generate an identification signal associated with the identification of each of the storage units.

4. The electronic device as claimed in claim 3, wherein the controller further comprises a platform management controller configured to determine whether the distance is longer than the distance threshold, and when the distance is longer than the distance threshold, the platform management controller is configured to output the control signal to the row fan to increase the rotation speed of the row fan.

5. The electronic device as claimed in claim 4,
wherein the platform management controller is configured to connect to the Internet and read the distance threshold of each of the storage units from a database according to the identification signal;
wherein the database is configured to store a table to record the identification of each of the storage units and the distance threshold corresponding to each of the storage units.

6. The electronic device as claimed in claim 1, further comprising a relative motion sensor and a distance sensor; wherein the relative motion sensor is configured to detect a relative motion of the storage array from a preset position with the row fan and to output a corresponding enable signal; wherein the distance sensor is configured to sense the distance between the memory array and the row fan according to the enable signal and output a corresponding distance signal.

7. The electronic device as claimed in claim 6, wherein the relative motion sensor is a far-infrared sensor.

8. The electronic device as claimed in claim 7, further comprising a drawer structure; wherein the row fan is disposed on a backplane, and the backplane faces a first plane of the drawer structure; the distance sensor is disposed on the backplane or the first plane of the drawer structure.

9. The electronic device as claimed in claim 8, further comprising a casing, wherein the drawer structure is disposed in the casing and is able to perform the relative motion with the casing in one direction.

10. The electronic device as claimed in claim 9, wherein the storage array is disposed in the drawer structure and the row fan is disposed on the casing.

11. The electronic device as claimed in claim 1, wherein when the distance is longer than the longest one of the distance thresholds of the storage units, the controller is configured to output the control signal to the row fan to increase the rotation speed of the row fan.

12. The electronic device as claimed in claim 1, wherein the distance threshold for each of the storage units is determined according to a level of the noise emitted by the row fan measured at the position of each of the storage units.

13. A control method of a rotation speed of a fan, suitable for an electronic device having a storage array, a row fan, a distance sensor, a relative motion sensor, and a controller, wherein the storage array comprises a plurality of storage units, the control method comprising:
the distance sensor senses a distance between the storage array and the row fan and outputs a corresponding distance signal;
the controller determines a distance threshold for each of the storage units; and when the controller determines that the distance exceeds the distance threshold according to the distance signal, the controller outputs a control signal to the row fan to increase the rotation speed of the row fan;

wherein determining the distance threshold for each of the storage units comprises:

changing the distance between each of the storage units and the row fan, and recording a decibel level of noise measured at a position of each of the storage units corresponding to different distances; and selecting a minimum distance corresponding to the noise that is under a predetermined decibel level as the distance threshold for each of the storage units;

wherein the predetermined decibel level is defined according to a working efficiency of each storage unit under influences of the noise emitted by the row fan.

14. The control method as claimed in claim 13, further comprising:

the relative motion sensor detects the relative motion of the storage array from a preset position with the row fan and outputs a corresponding enable signal; and the distance sensor senses the distance between the storage array and the row fan according to the enable signal.

15. The control method as claimed in claim 13, wherein the step of determining whether the distance exceeds the distance threshold and outputting the control signal to the row fan comprises:

in response to the controller determining that the distance is longer than the longest one of the distance thresholds of the storage units according to the distance signal, the controller outputs the control signal to the row fan to increase the rotation speed of the row fan.

16. The control method as claimed in claim 13, further comprises a step of setting the distance threshold for each of the storage units comprising:

the controller reads the identification of each of the storage units and generates an identification signal associated with the identification of each of the storage units; and the controller sets the distance threshold for each of the storage units according to the identification.

17. The control method as claimed in claim 16, wherein the step of setting the distance threshold for each of the storage units further comprises:

reading the distance threshold for each of the storage units from a database according to the identification signal.

18. The control method as claimed in claim 17, wherein the database comprises a table; the table records the identification of each of the storage units and the distance threshold corresponding to each of the storage units.

19. The control method as claimed in claim 17, further comprising:

determining the distance threshold for each of the storage units according to a level of the noise emitted by the row fan measured at the position of each of the storage units; and storing the distance threshold for each of the storage units in the database.

* * * * *